United States Patent
Cho

(10) Patent No.: US 11,963,112 B2
(45) Date of Patent: Apr. 16, 2024

(54) ELECTRONIC DEVICE AND METHOD FOR CONTROLLING TRANSMISSION POWER ON BASIS OF CONTROL INFORMATION

(71) Applicant: Samsung Electronics Co., Ltd., Suwon-si (KR)

(72) Inventor: Woosik Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 418 days.

(21) Appl. No.: 17/309,146

(22) PCT Filed: Oct. 17, 2019

(86) PCT No.: PCT/KR2019/013653
§ 371 (c)(1),
(2) Date: Apr. 29, 2021

(87) PCT Pub. No.: WO2020/091276
PCT Pub. Date: May 7, 2020

(65) Prior Publication Data
US 2021/0377881 A1    Dec. 2, 2021

(30) Foreign Application Priority Data
Oct. 29, 2018    (KR) .................. 10-2018-0130075

(51) Int. Cl.
*H04W 52/52*    (2009.01)
*H03F 1/56*    (2006.01)
(Continued)

(52) U.S. Cl.
CPC .............. *H04W 52/52* (2013.01); *H03F 1/56* (2013.01); *H03F 7/00* (2013.01); *H04W 52/226* (2013.01); *H03F 2200/451* (2013.01)

(58) Field of Classification Search
CPC . H04W 52/52; H04W 52/226; H04W 52/367; H03F 1/56; H03F 7/00;
(Continued)

(56) References Cited

U.S. PATENT DOCUMENTS

| 2012/0094708 A1* | 4/2012 | Park | ................ H04B 1/0458 455/522 |
| 2016/0127993 A1* | 5/2016 | Wang | ................ H04W 52/0229 370/311 |

(Continued)

FOREIGN PATENT DOCUMENTS

| JP | 2014-165659 A | 9/2014 |
| JP | 2015-207812 A | 11/2015 |

(Continued)

OTHER PUBLICATIONS

International Search Report and Written Opinion of the International Searching Authority in connection with International Application No. PCT/KR2019/013653, dated Jan. 30, 2020, 9 pages.

Office Action dated Nov. 15, 2022, in connection with Korean Application No. 10-2018-0130075, 12 pages.

(Continued)

*Primary Examiner* — Farid Seyedvosoghi

(57) ABSTRACT

Various embodiments of the present invention relate to an electronic device and a method for controlling transmission power, the electronic device comprising: an amplification circuit; an antenna electrically connected to the amplification circuit; a variable element capable of adjusting the impedance between the amplification circuit and the antenna; and a control circuit, wherein the control circuit can be configured to: output a signal, having been amplified by a designated gain by means of the amplification circuit, to an external electronic device by using the antenna, in a state in which the variable element is adjusted to a first impedance; detect the approach of an external object during outputting of the signal; in response to the detection of the approach of the external object, check control information by which the (Continued)

first impedance of the variable element can be changed to a second impedance; and adjust the designated gain on the basis of at least the control information.

13 Claims, 9 Drawing Sheets

(51) Int. Cl.
*H03F 7/00* (2006.01)
*H04W 52/22* (2009.01)

(58) Field of Classification Search
CPC ... H03F 2200/451; H03F 3/24; H04B 1/3827; H04B 1/401; H04B 1/3838
See application file for complete search history.

(56) References Cited

U.S. PATENT DOCUMENTS

2016/0182096 A1* 6/2016 Panioukov ............ H04B 1/0458
                                                                    343/861
2018/0076844 A1    3/2018 Park et al.

FOREIGN PATENT DOCUMENTS

| | | | | |
|---|---|---|---|---|
| JP | 2015207812 A | * | 11/2015 | |
| KR | 10-2004-0027161 A | | 4/2004 | |
| KR | 2004027161 A | * | 4/2004 | ........... H04B 1/3838 |
| KR | 10-0631645 B1 | | 10/2006 | |
| KR | 10-2012-0038152 A | | 4/2012 | |

* cited by examiner

ELECTRONIC DEVICE AND METHOD FOR CONTROLLING TRANSMISSION POWER ON BASIS OF CONTROL INFORMATION

CROSS-REFERENCE TO RELATED APPLICATIONS

This application is a 371 National Stage of International Application No. PCT/KR2019/013653 filed Oct. 17, 2019, which claims priority to Korean Patent Application No. 10-2018-0130075 filed Oct. 29, 2018, the disclosures of which are herein incorporated by reference in their entirety.

BACKGROUND

1. Field

Various embodiments of the disclosure relate to an electronic device and a method for controlling transmission power.

2. Description of Related Art

Electronic devices may radiate electromagnetic signals for wireless communication with external devices. Since electromagnetic signals may be harmful to a human body, regulatory organizations have prescribed specific absorption rate (SAR) limits for electronic devices.

An electronic device may reduce transmission power based on the frequency band of wireless communication, thereby performing control to prevent an absorption rate from exceeding a specific prescribed limit.

However, the conventional electronic device reduces the transmission power based only on the frequency band without considering the state of the electronic device, which may cause deterioration in the performance of an antenna when the electronic device is in a specific state.

Various embodiments of the disclosure may provide an electronic device and a method for selectively reducing transmission power in view of the frequency band of wireless communication and the state of the electronic device, thereby reducing deterioration in the performance of an antenna while complying with specific absorption rate regulations.

SUMMARY

An electronic device according to various embodiments of the disclosure may include: an amplification circuit; an antenna configured to be electrically connected to the amplification circuit; a variable element configured to adjust an impedance between the amplification circuit and the antenna; and a control circuit, wherein the control circuit may be configured to: output a signal amplified by a designated gain using the amplification circuit to an external electronic device using the antenna, with the variable element adjusted to a first impedance; detect that an external object is adjacent while outputting the signal; identify control information for changing the first impedance of the variable element to a second impedance upon detecting that the external object is adjacent; and adjust the designated gain based at least on the control information.

An operating method of an electronic device, which includes an amplification circuit, an antenna configured to be electrically connected to the amplification circuit, and a variable element configured to adjust an impedance between the amplification circuit and the antenna, according to various embodiments of the disclosure may include: outputting a signal amplified by a designated gain using the amplification circuit to an external electronic device using the antenna, with the variable element adjusted to a first impedance; detecting that an external object is adjacent while outputting the signal; identifying control information for changing the first impedance of the variable element to a second impedance upon detecting that the external object is adjacent; and adjusting the designated gain based at least on the control information.

An electronic device and a method according to various embodiments of the disclosure may selectively reduce transmission power in view of the frequency band of wireless communication and the state of the electronic device, thereby reducing deterioration in the performance of an antenna while complying with specific absorption rate regulations.

DETAILED DESCRIPTION

Figure 1:
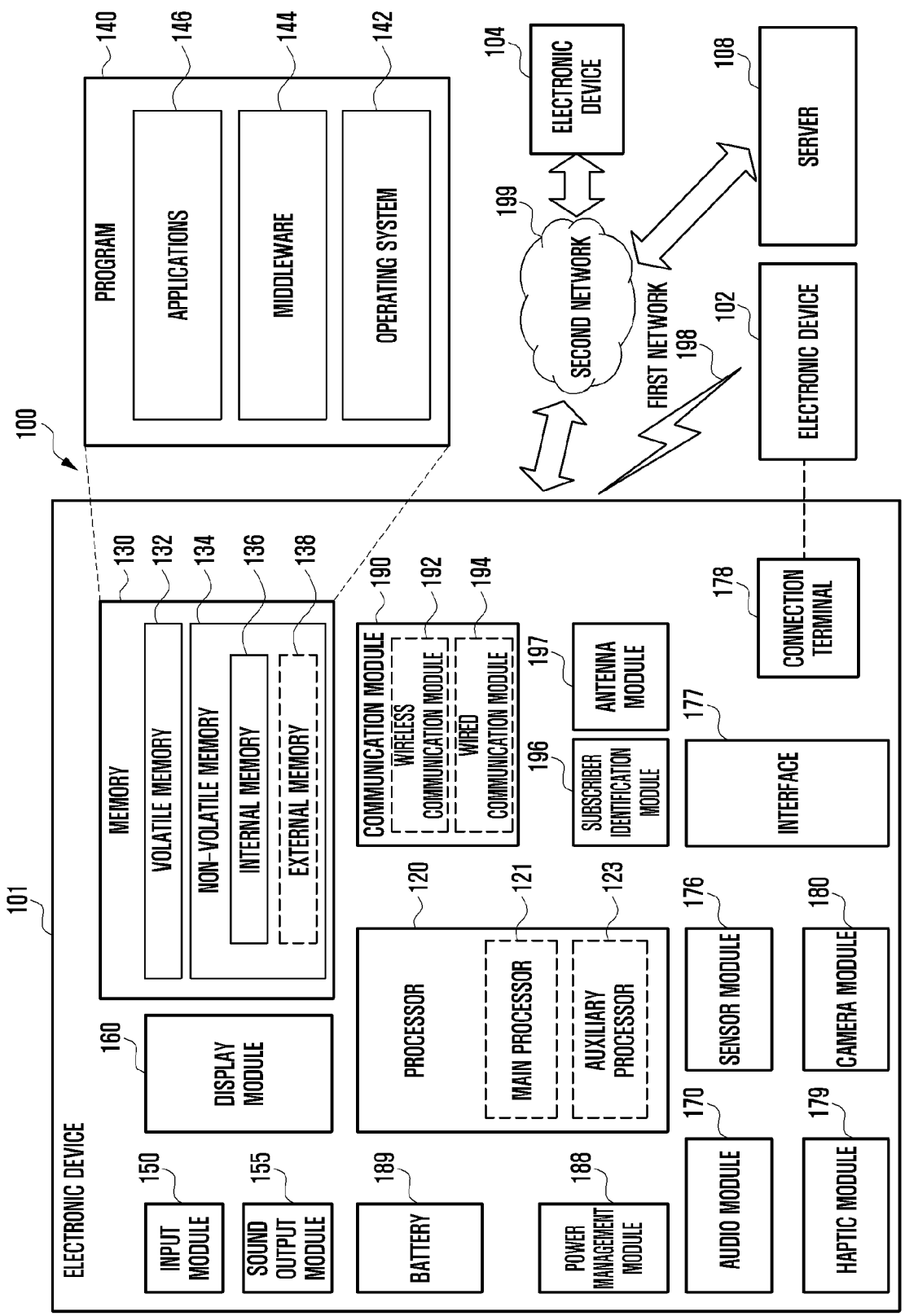
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device (e.g., the electronic device 200 of FIG. 2) according to various embodiments of the disclosure may include an amplification circuit (e.g., the amplification circuit 217 of FIG. 2), an antenna (e.g., the antennal 213 of FIG. 2) configured to be electrically connected to the amplification circuit 217, a variable element (e.g., the variable element 219 of FIG. 2) configured to adjust an impedance between the amplification circuit 217 and the antenna 213, and a control circuit (e.g., the processor 120 of FIG. 2), wherein the control circuit 120 may be configured to: output a designated signal amplified by a designated gain using the amplification circuit 217 to an external electronic device 200 using the antenna 213, with the variable element 219 adjusted to a first designated impedance; identify that the electronic device 200 is adjacent to an external object while outputting the designated signal; identify control information for changing the first designated impedance of the variable element 219 to a second designated impedance based at least on the determination that the electronic device 200 is adjacent to the external object; and adjust the designated gain based at least on the control information. The electronic device may further include a proximity sensor, and the control circuit 120 may be configured to identify that the electronic device 200 is adjacent to the external object using the proximity sensor. The control circuit 120 may be configured to: adjust the designated gain based on a first designated power adjustment value when it is determined that the designated control information belongs to a first designated group; and refrain from adjusting the designated gain when it is determined that the designated control information belongs to a second designated group. The control circuit 120 may be configured to: determine that the designated control information belongs to the first designated group when a transmission power value of a designated signal, output based on the second designated impedance, is greater than a first designated transmission power value; and determine that the designated control information belongs to the second designated group when the transmission power value of the designated signal, output based on the second designated impedance, is less than a second designated transmission power value, and the first designated transmission power value may be greater than the second designated transmission power value. The control circuit 120 may be configured to: determine that the designated control information belongs to a third group when the transmission power value of the designated signal output based on the second designated impedance is less than the first designated transmission power value and is greater than the second designated transmission power value; and adjust the designated gain based on a second designated power adjustment value when it is determined that the designated control information belongs to the third group, and the second designated power adjustment value may be less than the first designated power adjustment value. The variable element 219 may include at least one variable capacitor and at least one variable inductor.

An electronic device (e.g., the electronic device 200 of FIG. 2) according to various embodiments of the disclosure may include an amplification circuit (e.g., the amplification circuit 217 of FIG. 2), an antenna (e.g., the antennal 213 of FIG. 2) configured to be electrically connected to the amplification circuit 217, a variable element (e.g., the variable element 219 of FIG. 2) configured to adjust the impedance between the amplification circuit 217 and the antenna 213, and a control circuit (e.g., the processor 120 of FIG. 2), wherein the control circuit 120 may be configured to: output a designated signal amplified by a designated gain using the amplification circuit 217 to an external electronic device 200 using the antenna 213, with the variable element 219 adjusted to a first designated impedance; identify control information for changing the first designated impedance of the variable element 219 to a second designated impedance based at least on a determination that a frequency band of the designated signal is a designated frequency band; and adjust the designated gain based at least on the control information. The electronic device may further include a proximity sensor, and the control circuit 120 may be configured to identify that the electronic device 200 is adjacent to the external object using the proximity sensor. The control circuit 120 may be configured to: adjust the designated gain based on a first designated power adjustment value when it is determined that the designated control information belongs to a first designated group; and refrain from adjusting the designated gain when it is determined that the designated control information belongs to a second designated group. The control circuit 120 may be configured to: determine that the designated control information belongs to the first designated group when a transmission power value of a designated signal output based on the second designated impedance is greater than a first designated transmission power value; and determine that the designated control information belongs to the second designated group when the transmission power value of the designated signal output based on the second designated impedance is less than a second designated transmission power value, and the first designated transmission power value may be greater than the second designated transmission power value. The control circuit 120 may be configured to: determine that the designated control information belongs to a third group when the transmission power value of the designated signal output based on the second designated impedance is less than the first designated transmission power value and is greater than the second designated transmission power value; and adjust the designated gain based on a second designated power adjustment value when it is determined that the designated control information belongs to the third group, and the second designated power adjustment value may be less than the first designated power adjustment value. The variable element 219 may include at least one variable capacitor and at least one variable inductor.

An electronic device (e.g., the electronic device 200 of FIG. 2) according to various embodiments of the disclosure may include an amplification circuit (e.g., the amplification circuit 217 of FIG. 2), an antenna (e.g., the antennal 213 of FIG. 2) configured to be electrically connected to the amplification circuit 217, and a control circuit (e.g., the processor 120 of FIG. 2), wherein the control circuit 120 may be configured to: output a designated signal amplified by a designated gain using the amplification circuit 217 to an external electronic device 200 using the antenna 213; identify a frequency band of the designated signal; identify a first designated power adjustment value corresponding to the frequency band; determine designated control information among a plurality of pieces of control information based on the state of the electronic device 200; adjust the designated gain based on the first designated power adjustment value when it is determined that the designated control information belongs to a first designated group; and refrain from adjusting the designated gain when it is determined that the designated control information belongs to a second designated group. The electronic device may further include a variable element 219 configured to adjust an impedance between the amplification circuit 217 and the antenna 213, and the designated control information may be used to change a first designated impedance of the variable element 219, adjusted based on the identified frequency band, to a second designated impedance. The control circuit 120 may be configured to: determine that the designated control information belongs to the first designated group when a transmission power value of a designated signal output based on the second designated impedance is greater than a first designated transmission power value; and determine that the designated control information belongs to the second designated group when the transmission power value of the designated signal output based on the second designated impedance is less than a second designated transmission power value, and the first designated transmission power value may be greater than the second designated transmission power value. The control circuit 120 may be configured to: determine that the designated control information belongs to a third group when the transmission power value of the designated signal output based on the second designated impedance is less than the first designated transmission power value and is greater than the second designated transmission power value; and adjust the designated gain based on a second designated power adjustment value when it is determined that the designated control information belongs to the third group, and the second designated power adjustment value may be less than the first designated power adjustment value. The electronic device may further include a memory, and the memory may include a first lookup table in which a plurality of power adjustment values corresponding to a plurality of frequency bands is stored, a plurality of second lookup tables in which a plurality of pieces of control information for adjusting the impedance of the variable element 219 corresponding to each of a plurality of states of the electronic device 200 is stored, and a third lookup table in which the plurality of second lookup tables corresponding to the plurality of frequency bands is stored. The control circuit 120 may be configured to: determine a designated power adjustment value corresponding to the identified frequency band by referring to the first lookup table; determine a second designated lookup table corresponding to the identified frequency band by referring to the third lookup table; and determine the designated control information corresponding to the state of the electronic device 200 by referring to the second designated lookup table. The control circuit 120 may be configured to: identify, as the state of the electronic device 200, that the electronic device 200 is adjacent to an external object while outputting the designated signal; and determine the designated control information based at least on a determination that the electronic device 200 is adjacent to the external object. The electronic device may further include a proximity sensor, and the control circuit 120 may be configured to identify that the electronic device 200 is adjacent to the external object using the proximity sensor.

Figure 2:
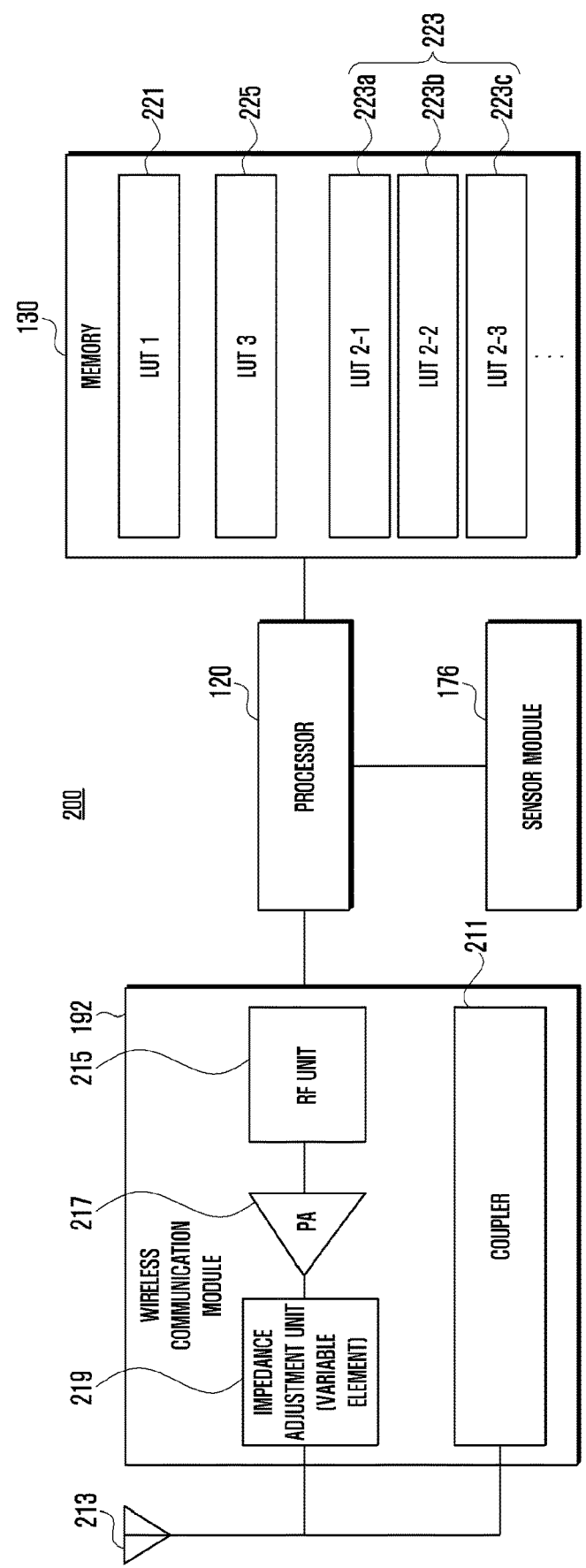
FIG. 2 illustrates the configuration of an electronic device according to various embodiments of the disclosure.

FIG. 2 illustrates the configuration of an electronic device according to various embodiments of the disclosure.

Referring to FIG. 2, the electronic device 200 (e.g., the electronic device 101 of FIG. 1) may include a wireless communication module 192 (e.g., the wireless communication module 192 of FIG. 1), a memory 130 (e.g., the memory 130 of FIG. 1), a sensor module 176 (e.g., the sensor module 176 of FIG. 1), or a processor 120 (e.g., the processor 120 of FIG. 1).

According to an embodiment, the wireless communication module 192 may perform functions for transmitting or receiving a wireless signal through a wireless channel under the control of the processor 120.

According to an embodiment, the wireless communication module 192 may perform a function of conversion between a baseband signal and a bit stream according to the physical-layer specification of the communication system, under the control of the processor 120. For example, in data transmission, the wireless communication module 192 may encode and modulate a transmitted bit stream to generate complex symbols. In another example, in data reception, the wireless communication module 192 may demodulate and decode a baseband signal to reconstruct a received bit stream.

According to an embodiment, the wireless communication module 192 may upconvert a baseband signal into an RF band signal and may transmit the RF band signal through an antenna 213, or may downconvert an RF band signal, received through the antenna 213, into a baseband signal. For example, the wireless communication module 192 may include a transmission filter, a reception filter, an amplifier, a mixer, an oscillator, a digital-to-analog converter (DAC), at least one transceiver, a modem, or an analog-to-digital converter (ADC).

According to an embodiment, the wireless communication module 192 may include an RF unit 215 to modulate a signal to be transmitted and to provide the signal to an amplification circuit electrically connected to the antenna 213 and an impedance adjustment unit 219 to adjust the impedance between the amplification circuit 217 and the antenna 213. For example, the impedance adjustment unit 219 may include a variable element, and the variable element may include at least one variable capacitor (not shown) and/or at least one variable inductor (not shown).

According to an embodiment, the impedance adjustment unit 219 (hereinafter, referred to as the variable element 219) may match the impedance of the antenna 213 and the impedance of a terminal before the antenna 213 based on control information determined by the processor 120, and may then transmit an amplified signal from the amplification circuit 217 through the antenna 213. For example, the processor 120 may output, through the antenna 213, a designated signal amplified by a designated gain using the amplification circuit 217 with the variable element 219 adjusted to a designated impedance. According to an embodiment, the control information may include a tuning code for adjusting the impedance of the variable element 219. For example, the control information may include a tuning code corresponding to at least one control signal for changing a first designated impedance of the variable element 219 to a second designated impedance different from the first designated impedance. According to an embodiment, the control signal may be a signal for controlling the variable capacitor and/or the variable inductor.

According to an embodiment, the wireless communication module 192 may include a coupler 211 to detect the power value of the antenna 213. For example, the coupler 211 may be a power detector, and may detect a coupling signal generated in an RF line connected to the antenna 213.

According to an embodiment, the memory 130 may include a first lookup table 221, a plurality of second lookup tables 223, or a third lookup table 225.

According to an embodiment, the first lookup table 221 may include a plurality of power adjustment values corresponding to a plurality of frequency bands. For example, as shown in Table 1, the first lookup table 221 may be a table storing a plurality of frequency bands and a plurality of power adjustment values corresponding to the plurality of frequency bands. According to various embodiments, the first lookup table 221 shown in Table 1 is only an example, and may be variously modified and changed without limitation.

TABLE 1

| Frequency band | Power adjustment value (dB) |
| --- | --- |
| LTE B7 | 2.0 |
| LTE B2 | 4.5 |
| LTE B4 | 4.0 |
| LTE B25 | 4.0 |
| LTE B30 | 3.0 |
| LTE B41 | 4.0 |
| LTE B66 | 4.5 |
| W2 | 4.0 |
| W4 | 4.0 |
| G1900 | 3.0 |
| BC1 | 4.0 |

According to an embodiment, the second lookup tables 223 may include a plurality of pieces of control information corresponding to a plurality of states of the electronic device 200. For example, the second lookup tables 223 may be tables storing a plurality of pieces of state information indicating a plurality of states of the electronic device 200 and a plurality of pieces of control information corresponding to the plurality of pieces of state information. According to an embodiment, the plurality of pieces of control information may include a tuning code for adjusting the impedance of the variable element 219. According to an embodiment, the plurality of states of the electronic device 200 may include an input to the electronic device 200, a state change, and surrounding information. For example, the states of the electronic device 200 may include the proximity of an external object to the electronic device. According to an embodiment, the processor 120 may control the impedance of the variable element 219 using the plurality of pieces of control information, thereby enabling the amplification circuit 217 to output a signal amplified by a designated gain.

According to an embodiment, the processor 120 may adjust the impedance of the variable element 219 according to the plurality of pieces of control information and may calculate the transmission power of an amplified signal from the amplification circuit 217 as a result of adjusting the impedance. For example, the processor 120 may associate the transmission power calculated according to the result of adjusting the impedance with designated control information, as shown by a graph 610 of FIG. 6. According to an embodiment, the processor 120 may store a table (e.g., the graph 610 of FIG. 6) in which the transmission power calculated according to the result of adjusting the impedance is associated with the control information (e.g., a tuning code) in the memory (e.g., the memory 130 of FIG. 1).

Figure 6:
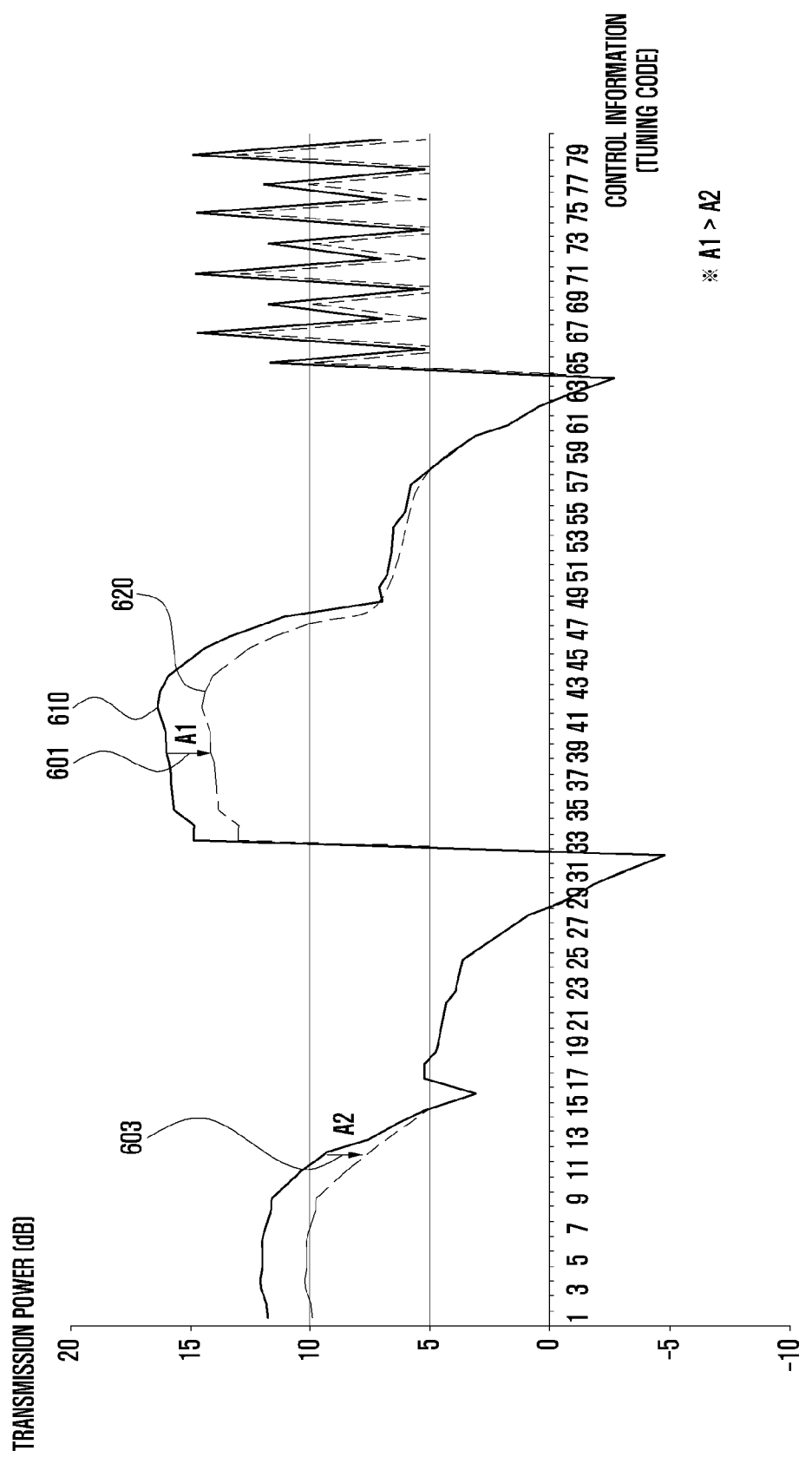
FIG. 6 is a graph illustrating a method of adjusting a plurality of transmission power values according to an embodiment of the disclosure.

According to various embodiments, the graph (or association table), in which the plurality of pieces of control information is associated with a plurality of transmission powers calculated based on the plurality of pieces of control information, as shown in FIG. 6, is only one example, and may be variously modified and changed without limitation.

According to an embodiment, the third lookup table 225 may include the plurality of second lookup tables 223 corresponding to the plurality of frequency bands. For example, as shown in Table 2, the third lookup table 225 may be a table storing the plurality of frequency bands and the plurality of second lookup tables 223 corresponding to the plurality of frequency bands. According to various embodiments, the third lookup table 225 shown in Table 2 is only an example, and may be variously modified and changed without limitation.

TABLE 2

| Frequency band | Second lookup table (e.g., second lookup tables 223 of FIG. 2) |
| --- | --- |
| LTE B7 | LUT 2-1 |
| LTE B2 | LUT 2-2 |
| LTE B4 | LUT 2-3 |
| LTE B25 | LUT 2-4 |
| LTE B30 | LUT 2-5 |
| LTE B41 | LUT 2-6 |
| LTE B66 | LUT 2-7 |
| W2 | LUT 2-8 |
| W4 | LUT 2-9 |
| G1900 | LUT 2-10 |

According to an embodiment, the sensor module 176 may detect an input to the electronic device 200, a state change, and surrounding information. According to an embodiment, the sensor module 176 may detect the distance between an external object (e.g., a user) and the electronic device 200 under the control of the processor 120. For example, the sensor module 176 may include a grip sensor to detect whether the electronic device 200 is in the state of being gripped. According to an embodiment, the electronic device 200 may determine whether the electronic device 200 is in the gripped state based on the distance to the user. In another example, the sensor module 176 may include a proximity sensor to detect the distance between the user and the electronic device 200.

According to an embodiment, the sensor module 176 may include an illuminance sensor to detect brightness information. For example, the electronic device 200 may determine whether the user is adjacent to the electronic device 200 using the illuminance sensor.

According to an embodiment, the sensor module 176 may detect a designated event. According to an embodiment, the event may be an event that affects the state of the electronic device 200. For example, the event may be an event that affects the state of a magnetic field of the electronic device 200. For example, the event may be an operation of the electronic device 200 turning on/off a module related to short-range communication. The module related to the short-range communication may be a Bluetooth module or an NFC communication module. For example, various wireless signals generated by the module related to the short-range communication may change a magnetic field between the electronic device 200 and the user.

According to an embodiment, the electronic device 200 may detect an event in which an earphone is inserted into an audio jack of the electronic device 200 or in which the earphone is disconnected from the audio jack through the sensor module 176. Since the earphone includes a cable through which current flows and a diaphragm operated by an electromagnet, the event may change the magnetic field between the electronic device 200 and the user.

According to an embodiment, the electronic device 200 may detect an event in which a case is placed on the electronic device 200 through the sensor module 176. For example, the case may operate as a hall integrated chip for the electronic device 200. For example, the case may produce a hall effect on the electronic device 200.

According to an embodiment, the electronic device 200 may detect an event in which an external device is connected to the electronic device 200 through the sensor module 176. For example, the external device may include a personal computer (PC), a TV, a printer, a universal serial bus (USB) storage device, or a charger.

According to an embodiment, the processor 120 may control all of the components of the electronic device 200. For example, the processor 120 may be electrically (e.g., operatively) connected to the wireless communication module 192, the memory 130, or the sensor module 176.

According to an embodiment, the processor 120 may identify a frequency band of wireless communication established with the external device and may determine a power adjustment value (e.g., a backoff value) corresponding to the identified frequency band. For example, the processor 120 may identify a frequency band of wireless communication currently established with a base station of a mobile operator and may determine a designated power adjustment value by referring to the first lookup table 221.

According to an embodiment, the processor 120 may determine designated control information among a plurality of pieces of control information (e.g., tuning codes) corresponding to a plurality of transmission power values, based on the state of the electronic device 200. For example, the processor 120 may identify the state of the electronic device 200 using the sensor module 176, may determine a designated second lookup table (e.g., LUT 2-1 223a of FIG. 2) corresponding to the frequency band of the currently established wireless communication by referring to the third lookup table 225, and may determine designated control information corresponding to the identified state of the electronic device 200 by referring to the designated second lookup table (e.g., LUT 2-1 223a of FIG. 2).

According to an embodiment, the processor 120 may calculate the transmission power value of an amplified signal from the amplification circuit 217 according to the result of adjusting the impedance of the variable element 219 according to the designated control information.

According to an embodiment, the processor 120 may compare the calculated transmission power value with a designated value and may adjust the transmission power of the amplified signal from the amplification circuit 217 based on the result of the comparison.

For example, when the calculated transmission power value is equal to or greater than the designated value, the processor 120 may set the transmission power to a value obtained by subtracting the designated power adjustment value from the transmission power value calculated based on the designated control information. For example, when the transmission power value calculated based on the designated control information is relatively high, the processor 120 may reduce the transmission power by adjusting the gain of the amplification circuit 217. In another example, when the calculated transmission power value is less than the designated value, the processor 120 may refrain from adjusting the gain of the amplification circuit 217 to thereby reduce the transmission power. For example, when the transmission power value corresponding to the designated control information is relatively low, the processor 120 does not apply a backoff to the transmission power, thereby preventing the occurrence of communication failure due to an excessive reduction in transmission power.

Hereinafter, an operating method of the foregoing electronic device (e.g., the electronic device 200 of FIG. 2) according to various embodiments of the disclosure will be described.

Figure 3:
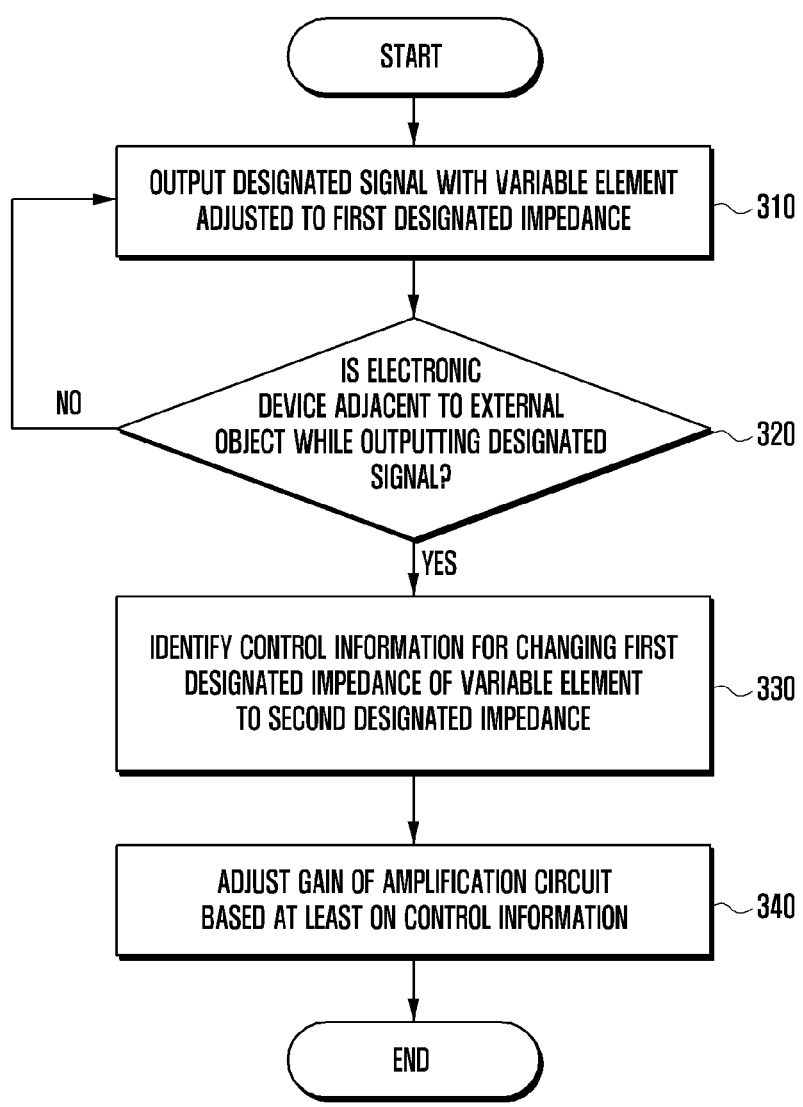
FIG. 3 is a flowchart illustrating the operation of an electronic device according to an embodiment of the disclosure.

FIG. 3 is a flowchart illustrating the operation of an electronic device according to an embodiment of the disclosure.

In operation 310, the electronic device (e.g., the electronic device 200 of FIG. 2) according to an embodiment may establish wireless communication with an external device through a wireless communication module (e.g., the wireless communication module 192 of FIG. 2), and may output a designated signal with a variable element 219 adjusted to a first designated impedance.

In operation 320, the electronic device 200 according to an embodiment may identify whether the electronic device 200 is adjacent to an external object while outputting the designated signal.

For example, a processor (e.g., the processor 120 of FIG. 1) may detect that the electronic device 200 is adjacent to the external object using a proximity sensor. According to an embodiment, when the distance from the electronic device 200 to the external object is less than a designated value, the processor 120 may determine that the external object and the electronic device 200 are adjacent to each other. According to various embodiments, various devices other than the proximity sensor may be used to detect whether the electronic device 200 is adjacent to the external object. For example, the processor 120 may determine whether the electronic device is adjacent to the external object using a grip sensor or an illuminance sensor.

When it is identified that the electronic device 200 is adjacent to the external object while outputting the designated signal (e.g., when the result of operation 320 is Yes), the electronic device 200 according to an embodiment may identify control information for changing the first designated impedance of the variable element 219 to a second designated impedance in operation 330. For example, the control information may include a tuning code corresponding to at least one control signal for changing the first designated impedance of the variable element 219 to the second designated impedance, which is different from the first designated impedance. According to an embodiment, the control signal may be a signal for controlling a variable capacitor and/or a variable inductor as the variable element 219.

According to an embodiment, when it is not identified that the electronic device 200 is adjacent to the external object while outputting the designated signal (e.g., when the result of operation 320 is No), the electronic device 200 according to an embodiment may perform operation 320 again to identify whether the electronic device is adjacent to the external object or may perform operation 310.

In operation 340, the electronic device 200 according to an embodiment may adjust the gain of an amplification circuit 217 based at least on the control information. According to an embodiment, the processor 120 may adjust the impedance of the variable element 219 according to the control information and may calculate the transmission power of an amplified signal from the amplification circuit 217 according to the result of adjusting the impedance.

According to an embodiment, the processor 120 may compare the calculated transmission power value with a designated value and may adjust the transmission power of the amplified signal from the amplification circuit 217 based on the result of the comparison.

According to an embodiment, when the calculated transmission power value is equal to or greater than the designated value, the processor 120 may set the transmission power to a value obtained by subtracting the designated power adjustment value from the transmission power value calculated based on the designated control information. For example, when the transmission power value calculated based on the designated control information is relatively high, the processor 120 may reduce the transmission power by adjusting the gain of the amplification circuit 217.

According to an embodiment, when the calculated transmission power value is less than the designated value, the processor 120 may refrain from adjusting the gain of the amplification circuit 217 to reduce the transmission power. For example, when the transmission power value corresponding to the designated control information is relatively low, the processor 120 does not apply a backoff to the transmission power, thereby preventing the occurrence of communication failure due to an excessive reduction in transmission power.

Figure 4:
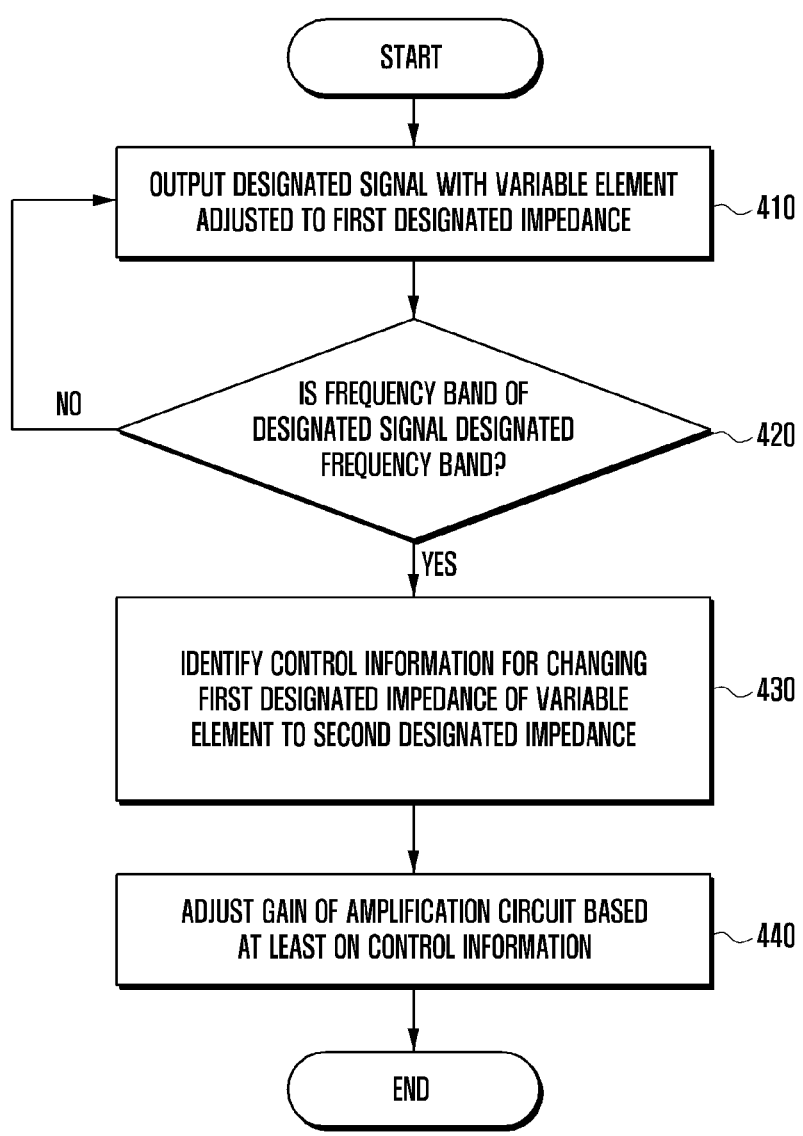
FIG. 4 is a flowchart illustrating the operation of an electronic device according to another embodiment of the disclosure.

FIG. 4 is a flowchart illustrating the operation of an electronic device according to another embodiment of the disclosure.

In operation 410, the electronic device (e.g., the electronic device 200 of FIG. 2) according to an embodiment may establish wireless communication with an external device through a wireless communication module (e.g., the wireless communication module 192 of FIG. 2), and may output a designated signal with a variable element 219 adjusted to a first designated impedance.

In operation 420, the electronic device 200 according to an embodiment may identify whether the frequency band of the designated signal is a designated frequency band.

When the frequency band of the designated signal is the designated frequency band (e.g., when the result of operation 420 is Yes), the electronic device 200 according to an embodiment may identify control information for changing the first designated impedance of the variable element 219 to a second designated impedance in operation 430.

According to an embodiment, when the frequency band of the designated signal is not the designated frequency band (e.g., when the result of operation 420 is No), the electronic device 200 may perform operation 420 again to identify whether the frequency band of the designated signal is the designated frequency band, or may perform operation 410.

In operation 440, the electronic device 200 according to an embodiment may adjust the gain of an amplification circuit 217 based at least on control information. According to an embodiment, a processor (e.g., the processor 120 of FIG. 1) may adjust the impedance of the variable element 219 according to the control information and may calculate the transmission power of an amplified signal from the amplification circuit 217 according to the result of adjusting the impedance. According to an embodiment, the processor 120 may compare the calculated transmission power value with a designated value and may adjust the transmission power of the amplified signal from the amplification circuit 217 based on the result of the comparison. For example, when the calculated transmission power value is equal to or greater than the designated value, the processor 120 may set the transmission power to a value obtained by subtracting the designated power adjustment value from the transmission power value calculated based on the designated control information. For example, when the transmission power value calculated based on the designated control information is relatively high, the processor 120 may reduce the transmission power by adjusting the gain of the amplification circuit 217. In another example, when the calculated transmission power value is less than the designated value, the processor 120 may refrain from adjusting the gain of the amplification circuit 217 to reduce the transmission power. For example, when the transmission power value corresponding to the designated control information is relatively low, the processor 120 does not apply a backoff to the transmission power, thereby preventing the occurrence of a communication failure due to an excessive reduction in transmission power.

Figure 5:
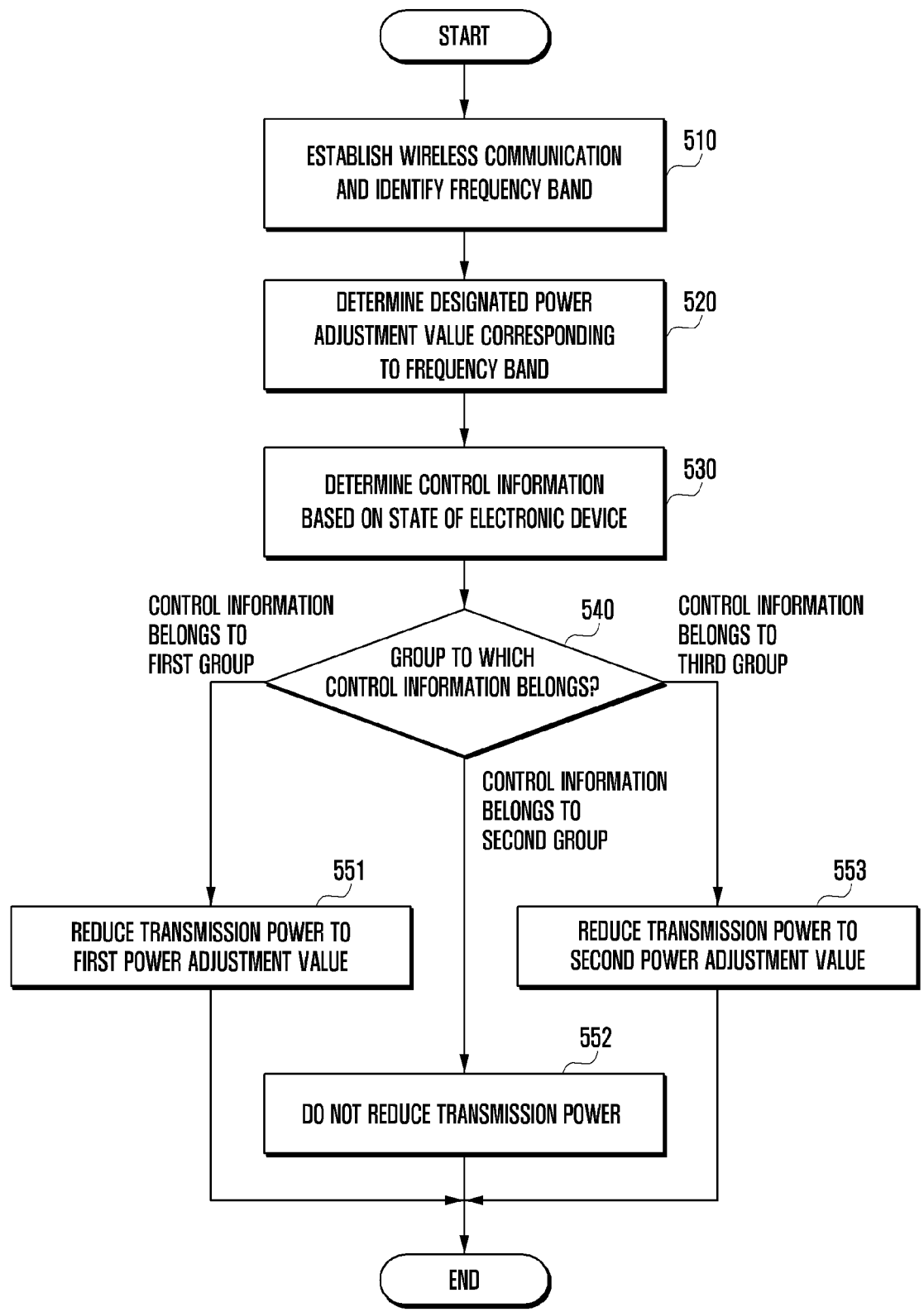
FIG. 5 is a flowchart illustrating the operation of an electronic device according to another embodiment of the disclosure.

FIG. 5 is a flowchart illustrating the operation of an electronic device according to another embodiment of the disclosure.

In operation 510, the electronic device (e.g., the electronic device 200 of FIG. 2) according to an embodiment may establish wireless communication with an external device through a wireless communication module (e.g., the wireless communication module 192 of FIG. 2), and may identify a frequency band when the wireless communication is established. For example, the electronic device 200 may identify a frequency band of wireless communication currently established with a base station of a mobile operator.

In operation 520, the electronic device 200 according to an embodiment may determine a designated power adjustment value corresponding to the frequency band. According to an embodiment, the electronic device 200 may determine the designated power adjustment value by referring to a first lookup table (e.g., the first lookup table 221 of FIG. 2). For example, the electronic device 200 may determine the designated power adjustment value corresponding to the identified frequency band among a plurality of power adjustment values included in the first lookup table 221. According to an embodiment, the first lookup table 221 may be included in a memory 130.

In operation 530, the electronic device 200 according to an embodiment may determine control information based on the state of the electronic device 200.

According to an embodiment, the electronic device 200 may determine a designated second lookup table (e.g., LUT 2-1 223*a* of FIG. 2) among a plurality of second lookup tables (e.g., the second lookup tables 223 of FIG. 2) based on the identified frequency band. According to an embodiment, the electronic device 200 may determine designated control information corresponding to the state of the electronic device 200 by referring to the designated second lookup table (e.g., LUT 2-1 223*a* of FIG. 2). For example, the electronic device 200 may determine the designated control information corresponding to the state of the electronic device 200 among a plurality of pieces of control information included in the designated second lookup table (e.g., LUT 2-1 223*a* of FIG. 2).

In operation 540, the electronic device 200 according to an embodiment may determine a group to which the designated control information belongs.

According to an embodiment, the electronic device 200 may calculate the transmission power value of an amplified signal from an amplification circuit 217 according to the result of adjusting the impedance of a variable element 219 according to the designated control information.

According to an embodiment, the electronic device 200 may compare the calculated transmission power value with a designated value and may determine which of first to third groups the designated control information belongs to based on the result of the comparison. For example, when the transmission power value calculated based on the designated control information is greater than a first designated transmission power value, the electronic device 200 may determine that the designated control information belongs to the first group, when the transmission power value calculated based on the designated control information is less than a second designated transmission power value, the electronic device 200 may determine that the designated control information belongs to the second group, and when the transmission power value calculated based on the designated control information is less than the first designated transmission power value and is greater than the second designated transmission power value, the electronic device 200 may determine that the designated control information belongs to the third group.

According to an embodiment, the first designated transmission power value may be greater than the second designated transmission power value.

When the designated control information belongs to the first group (e.g., when the transmission power value calculated based on the designated control information is greater than the first designated transmission power value), the electronic device 200 according to an embodiment may reduce the transmission power to a first power adjustment value in operation 551. For example, the electronic device 200 may set the transmission power to a value obtained by subtracting the designated power adjustment value from the calculated transmission power value. For example, when the transmission power value corresponding to the designated control information is relatively high, the electronic device 200 may reduce the transmission power by applying a backoff to the transmission power.

When the designated control information belongs to the second group (e.g., when the transmission power value calculated based on the designated control information is less than the second designated transmission power value), the electronic device 200 according to an embodiment may not reduce the transmission power in operation 552. For example, the electronic device 200 may set the transmission power to the calculated transmission power value. For example, when the calculated transmission power value is less than the designated value, the electronic device 200 may refrain from adjusting the gain of the amplification circuit 217 to thereby reduce the transmission power. According to various embodiments of the disclosure, when the transmission power value corresponding to the designated control information is relatively low, the electronic device 200 may not apply a backoff to the transmission power, thereby preventing an excessive reduction in the transmission power. When the transmission power value based on the control information is relatively low, the electronic device 200 according to various embodiments may not apply a backoff to the transmission power, thereby reducing deterioration in the performance of an antenna 213.

When the designated control information belongs to the third group (e.g., when the transmission power value calculated based on the designated control information is less than the first designated transmission power value and is greater than the second designated transmission power value), the electronic device 200 may reduce the transmission power to a second power adjustment value in operation 553. For example, the electronic device 200 may reduce the designated power adjustment value and may reduce the transmission power based on the reduced power adjustment value. For example, when the designated control information belongs to the third group, the electronic device 200 may reduce the first designated power adjustment value to the second designated power adjustment value and may reduce the transmission power based on the second designated power adjustment value. For example, when the transmission power value corresponding to the designated control information is a relatively intermediate value, the electronic device 200 may apply a reduced backoff to the transmission power. In another example, when the transmission power value corresponding to the designated control information is a relatively intermediate value, the electronic device 200 may apply a backoff but may reduce the extent to which the transmission power is backed off.

FIG. 6 is a graph illustrating a method of adjusting a plurality of transmission power values according to an embodiment of the disclosure.

In the illustrated embodiment, the graph 610 indicates one designated second lookup table (e.g., LUT 2-1 223a of FIG. 2) among a plurality of second lookup tables (e.g., the second lookup tables 223 of FIG. 2) included in a third lookup table (e.g., the third lookup table 225 of FIG. 2), and a graph 620 shows an example in which an operation of reducing transmission power is selectively applied based on the result of comparing a transmission power value calculated based on pieces of control information with a designated transmission power value according to various embodiments.

Referring to FIG. 6, the designated second lookup table (e.g., LUT 2-1 223a of FIG. 2) according to an embodiment may store a plurality of pieces of control information (e.g., a horizontal axis in FIG. 6) corresponding to the state of an electronic device 200 and a plurality of transmission power values (e.g., a vertical axis in FIG. 6) calculated according to the result of adjusting the impedance of a variable element 219 based on the plurality of pieces of control information.

According to an embodiment, the electronic device (e.g., the electronic device 200 of FIG. 2) may classify the plurality of pieces of control information into a first group to a third group according to the transmission power values calculated based on the plurality of pieces of control information.

Referring to the graph 610 of FIG. 6, when a transmission power value calculated based on designated control information is greater than a first designated transmission power value, the electronic device 200 according to an embodiment may determine that the designated control information belongs to the first group. According to the illustrated embodiment, the first designated transmission power value is set to 10 dB, but may not be limited to 10 dB. For example, the electronic device 200 may determine pieces of control information for calculating a transmission power value greater than 10 dB as the first group. For example, as illustrated in the graph 610, since a transmission power value greater than 10 dB is calculated based on control information 41 according to the result of adjusting the impedance, the electronic device 200 may determine that control information 41 belongs to the first group.

According to an embodiment, when designated control information corresponding to the state of the electronic device 200 belongs to the first group, the electronic device 200 may set transmission power to a value obtained by subtracting a designated first power adjustment value 601 (A1) from a transmission power value calculated based on the designated control information. For example, as illustrated in the graph 620, the electronic device 200 may control the gain of an amplification circuit 217 so that the transmission power is a value obtained by subtracting the designated first power adjustment value 601 (A1) from the transmission power value calculated based on control information 41, for example, 15 dB, based on the determination that control information 41 belongs to the first group.

Referring to graph 610 of FIG. 6, when the transmission power value calculated based on the designated control information is less than a second designated transmission power value, the electronic device 200 according to an embodiment may determine that the designated control information belongs to the second group. According to the illustrated embodiment, the second designated transmission power value is set to 5 dB, but may not be limited to 5 dB. For example, the electronic device 200 may determine pieces of control information for calculating a transmission power value less than 5 dB as the second group. For example, as illustrated in the graph 610, since a transmission power value less than 5 dB is calculated based on control information 31 according to the result of adjusting the impedance, the electronic device 200 may determine that control information 31 belongs to the second group.

According to an embodiment, when the designated control information corresponding to the current state of the electronic device 200 belongs to the second group, the electronic device 200 may set the transmission power to a transmission power value corresponding to the designated control information. For example, when the designated control information belongs to the second group, the electronic device 200 may not apply a backoff to the transmission power. For example, as illustrated in the graph 620, based on the determination that control information 31 belongs to the second group, the electronic device 200 may not apply a backoff, and may control the gain of the amplification circuit 217 so that the transmission power is a transmission power value calculated based on control information 31, for example, −3 dB.

Referring to graph 610 of FIG. 6, when the transmission power value calculated based on the designated control information is less than the first designated transmission power value and is greater than the second designated transmission power value, the electronic device 200 according to an embodiment may determine that the designated control information belongs to the third group. For example, the electronic device 200 may determine pieces of control information for calculating a transmission power value that is less than 10 dB and is greater than 5 dB to be the third group. For example, as illustrated in the graph 610, since a transmission power value that is less than 10 dB and is greater than 5 dB is calculated based on control information 11 according to a result of adjusting the impedance, the electronic device 200 may determine that control information 11 belongs to the third group.

According to an embodiment, when the designated control information corresponding to the current state of the electronic device 200 belongs to the third group, the electronic device 200 may set a designated second power adjustment value 603 (A2) less than the designated first power adjustment value 601 (A1) and may set the transmission power to a value obtained by subtracting the designated second power adjustment value 603 (A2) from the transmission power value corresponding to the designated control information. For example, as illustrated in the graph 620, the electronic device 200 may control the gain of the amplification circuit 217 so that the transmission power is a value obtained by subtracting the designated second power adjustment value 603 (A2) from the transmission power value corresponding to control information 11, for example, 9 dB, based on the determination that control information 11 belongs to the third group.

Figure 7:
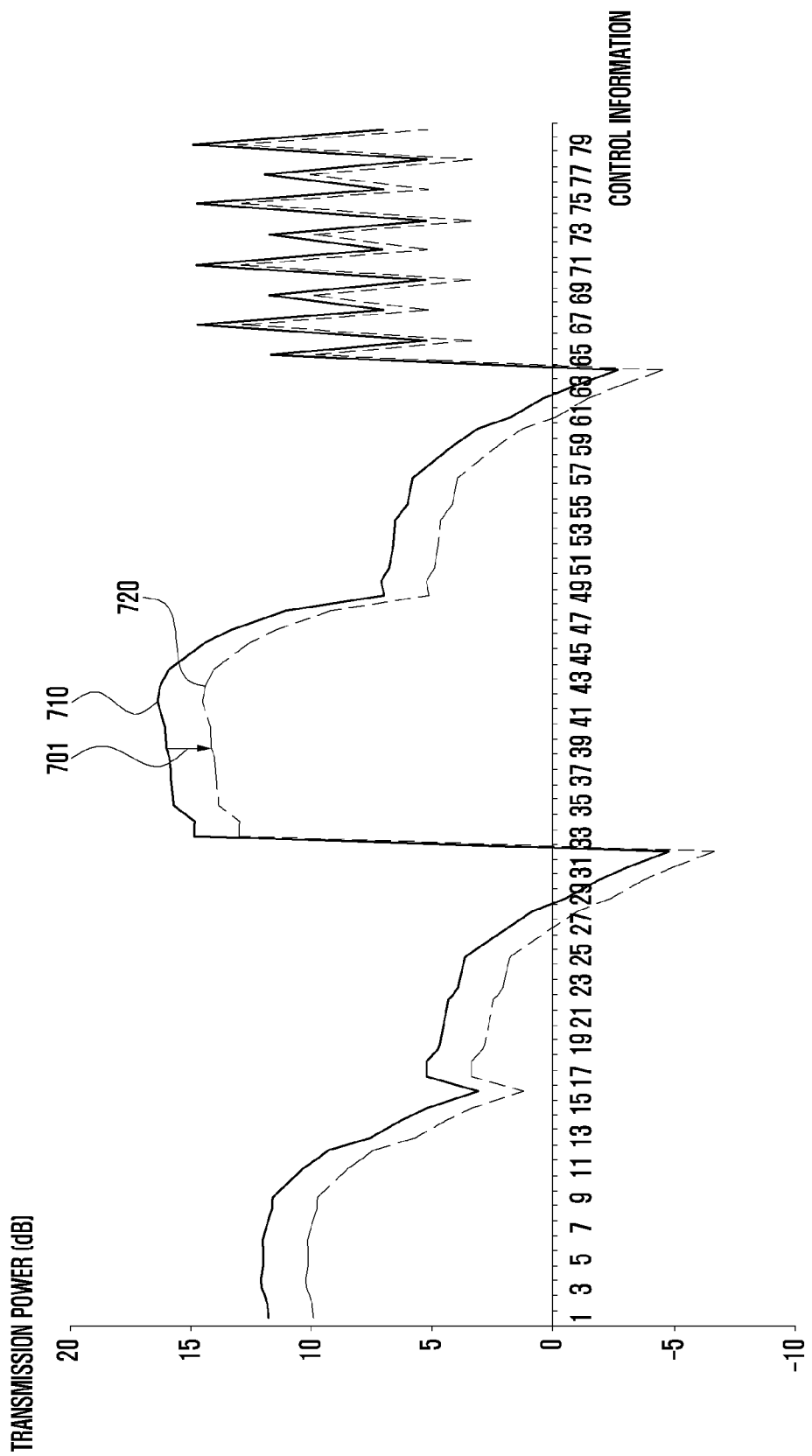
FIG. 7 is a graph illustrating a method of adjusting a plurality of transmission power values according to a comparative example.

FIG. 7 is a graph illustrating a method of adjusting a plurality of transmission power values according to a comparative example.

In the illustrated example, the graph 710 indicates one designated second lookup table (e.g., LUT 2-1 223a of FIG. 2) among a plurality of second lookup tables (e.g., the second lookup tables 223 of FIG. 2) included in a third lookup table (e.g., the third lookup table 225 of FIG. 2), and a graph 720 shows a transmission power value where an operation of reducing transmission power is applied regardless of transmission power values calculated based on pieces of control information according to the comparative example.

Referring to FIG. 7, the designated second lookup table (e.g., LUT 2-1 223a of FIG. 2) according to an embodiment may store a plurality of pieces of control information (e.g., a horizontal axis in FIG. 7) corresponding to the state of an electronic device and a plurality of transmission power values (e.g., a vertical axis in FIG. 7) calculated according to the result of adjusting the impedance of a variable element 219 based on the plurality of pieces of control information.

As illustrated in the graph 720, an electronic device according to the comparative example may reduce the transmission power by a power adjustment value based on a frequency band regardless of the transmission power values corresponding to the pieces of control information. For example, the electronic device according to the comparative example may set the transmission power to a value obtained by subtracting the power adjustment value 501 based on the frequency band from the transmission power values corresponding to the pieces of control information.

The electronic device according to the comparative example may reduce the transmission power by the power adjustment value based on the frequency band even when control information for generating relatively low transmission power is selected based on the state of the electronic device. For example, even when control information 31 for calculating a transmission power value of −3 dB is selected, the electronic device according to the comparative example may reduce the transmission power by the power adjustment value based on the frequency band, thereby causing deterioration in the performance of an antenna 213.

As illustrated in graph 620 of FIG. 6, an electronic device (e.g., the electronic device 200 of FIG. 2) according to various embodiments of the disclosure does not reduce the transmission power when control information 31 is selected, thereby preventing deterioration in the performance of an antenna (e.g., the antenna 213 of FIG. 2) that may occur in the comparative example.

Figure 8:
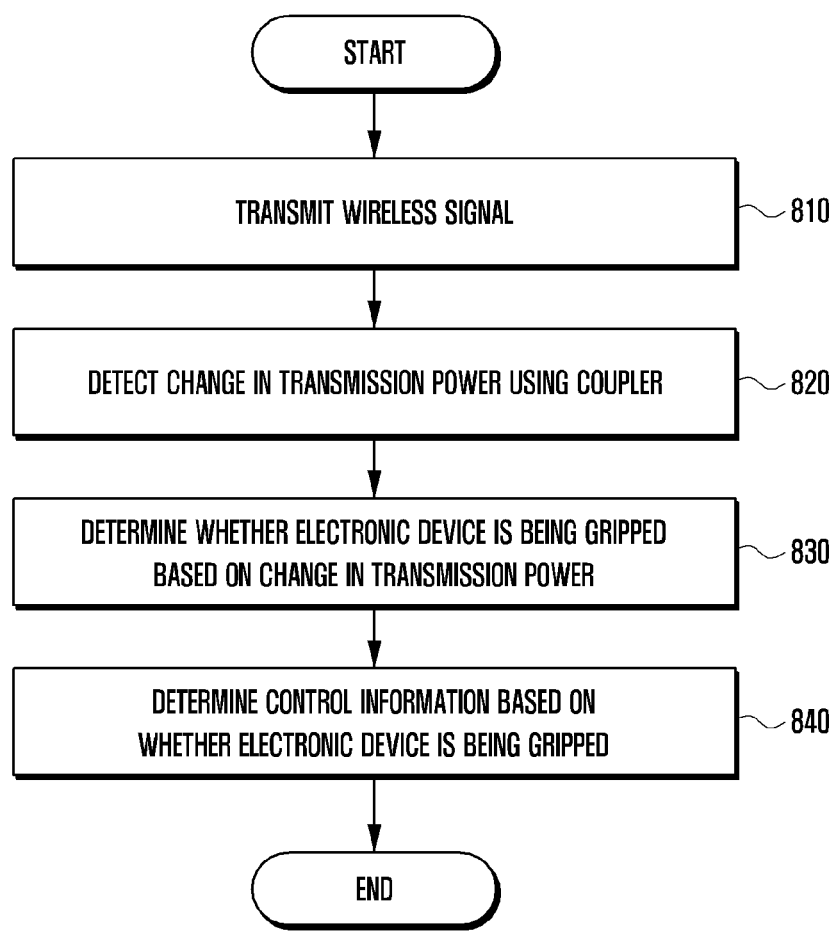
FIG. 8 is a flowchart illustrating a method for determining whether an electronic device is gripped.

FIG. 8 is a flowchart illustrating a method for determining whether an electronic device is gripped.

In operation 810, the electronic device (e.g., the electronic device 200 of FIG. 2) according to an embodiment may transmit a wireless signal based on an identified frequency band. For example, the electronic device 200 may transmit the wireless signal through an antenna (e.g., the antenna 213 of FIG. 2), and may transmit the wireless signal with a designated transmission power value.

In operation 820, the electronic device 200 according to an embodiment may detect a change in the transmission power value using a coupler (e.g., the coupler 211 of FIG. 2) while transmitting the wireless signal. For example, when an external object (e.g., a dielectric or a conductor) approaches or comes into contact with the antenna 213, the transmission power value changes, and the electronic device 200 may detect the change in the transmission power value.

In operation 830, the electronic device 200 according to an embodiment may determine whether the electronic device 200 is gripped based on a change in transmission power. For example, the electronic device 200 may determine that the electronic device 200 is being gripped when a variation in the transmission power exceeds a designated value. According to various embodiments, the method for determining whether the electronic device 200 is in the gripped state is not limited to the foregoing method of using the variance in the transmission power, and various methods may be selectively applied.

In operation 840, the electronic device 200 according to an embodiment may determine control information based on whether the electronic device 200 is in the gripped state. For example, the electronic device 200 may determine designated control information for changing a first designated impedance of a variable element 219 to a second designated impedance based on the determination that the electronic device 200 is in the gripped state.

According to an embodiment, when the control information is determined based on whether the electronic device 200 is in the gripped state, the electronic device 200 may selectively perform an operation of reducing the transmission power based on a transmission power value calculated based on the determined control information. For example, the electronic device 200 may perform any one of operations 551 to 553 illustrated in FIG. 5 based on the transmission power value calculated based on the determined control information.

Figure 9:
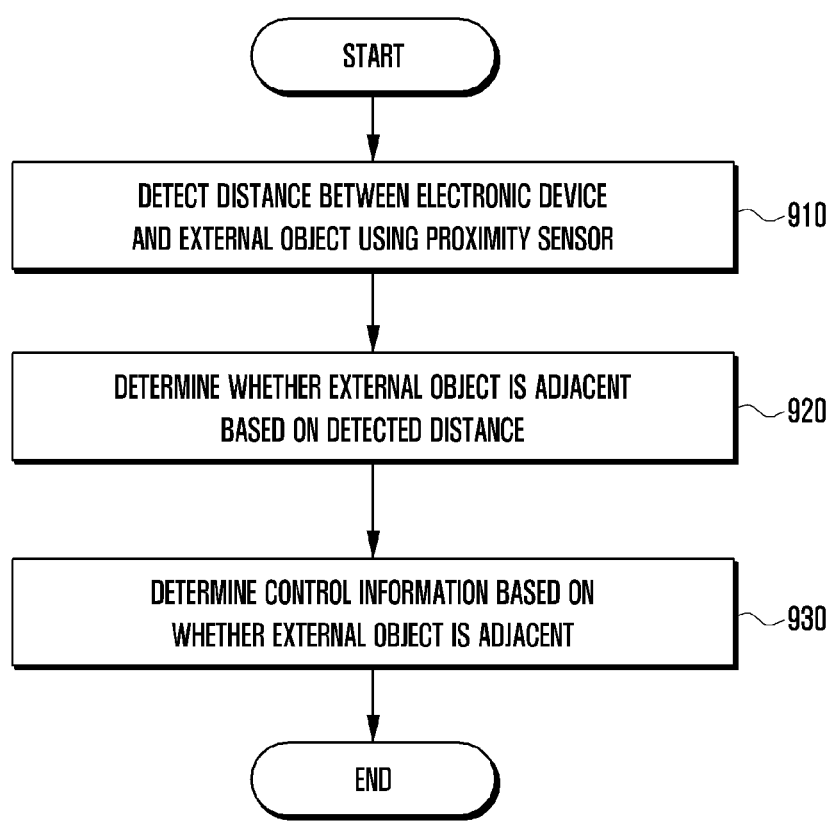
FIG. 9 is a flowchart illustrating a method for determining whether an electronic device is adjacent to an external object.

FIG. 9 is a flowchart illustrating a method for determining whether an electronic device is adjacent to an external object.

In operation 910, the electronic device (e.g., the electronic device 200 of FIG. 2) according to an embodiment may detect the distance between the electronic device 200 and the external object using a proximity sensor. According to various embodiments, the method by which the electronic device 200 detects the distance to the external object is not limited to the foregoing method of using the proximity sensor, and various methods may be selectively applied. For example, according to another embodiment, the electronic device 200 may detect a variance in transmission power using a coupler (e.g., the coupler 211 of FIG. 2) and may detect the distance between the electronic device 200 and the external object based on the variance in the transmission power.

In operation 920, the electronic device 200 according to an embodiment may determine whether the external object is adjacent thereto based on the distance to the external object. For example, when the distance to the external object is a designated value or less, the electronic device 200 may determine that the external object is adjacent thereto.

In operation 930, the electronic device 200 according to an embodiment may determine control information based on whether the external object is adjacent. For example, the electronic device 200 may determine designated control information for changing a first designated impedance of a variable element 219 to a second designated impedance based on the external object being adjacent.

According to an embodiment, when the control information is determined based on whether the external object is adjacent, the electronic device 200 may selectively perform an operation of reducing the transmission power value based on a transmission power value calculated based on the determined control information. For example, the electronic device 200 may perform any one of operations 551 to 553 illustrated in FIG. 5 based on the transmission power value calculated based on the determined control information.

The electronic device 200 according to various embodiments may detect the state of the electronic device 200 using various methods other than the examples illustrated in FIG. 8 and FIG. 9, and may determine control information based on the detected state of the electronic device 200. When the control information is determined based on the state of the electronic device 200, the electronic device 200 according to various embodiments may selectively perform an operation of reducing the transmission power value based on a transmission power value calculated based on the determined control information. For example, the electronic device 200 may perform any one of operations 551 to 553 illustrated in FIG. 5 based on the transmission power value corresponding to the determined control information. According to various embodiments, the state of the electronic device 200 may include the state in which the electronic device 200 is gripped, the state in which the electronic device 200 is being charged, the state in which a camera function is executed, the state in which proximity of an external object to the electronic device 200 is not detected, and/or the state in which the electronic device 200 is covered by the external object.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
    an amplification circuit;
    an antenna configured to be electrically connected to the amplification circuit;
    a variable element configured to adjust an impedance between the amplification circuit and the antenna; and
    a control circuit, wherein the control circuit is configured to:
  output a signal amplified by a designated gain using the amplification circuit to an external electronic device using the antenna, with the variable element adjusted to a first impedance;
  detect that an external object is adjacent while outputting the signal;
  identify a tuning code for changing the first impedance of the variable element to a second impedance upon detecting that the external object is adjacent;
  adjust the designated gain based on a first power adjustment value when the tuning code belongs to a first group; and
  refrain from adjusting the designated gain when the tuning code belongs to a second group.

2. The electronic device as claimed in claim 1, further comprising a proximity sensor,
  wherein the control circuit is configured to detect that the external object is adjacent using the proximity sensor.

3. The electronic device as claimed in claim 1, wherein the control circuit is configured to:
  determine that the tuning code belongs to the first group when a transmission power value of a signal output based on the second impedance is greater than a first transmission power value; and
  determine that the tuning code belongs to the second group when the transmission power value of the signal output based on the second impedance is less than a second transmission power value, and
  the first transmission power value is greater than the second transmission power value.

4. The electronic device as claimed in claim 3, wherein the control circuit is configured to:
  determine that the tuning code belongs to a third group when the transmission power value of the signal output based on the second impedance is less than the first transmission power value and is greater than the second transmission power value; and
  adjust the designated gain based on a second power adjustment value when the tuning code belongs to the third group, and
  the second power adjustment value is less than the first power adjustment value.

5. The electronic device as claimed in claim 1, wherein the variable element comprises at least one variable capacitor and at least one variable inductor.

6. The electronic device as claimed in claim 1, wherein the control circuit is configured to adjust the designated gain based at least on the tuning code when a frequency band of the signal is a designated frequency band.

7. The electronic device as claimed in claim 1, further comprising a memory,
  wherein the memory stores:
    a first lookup table in which a plurality of power adjustment values corresponding to a plurality of frequency bands is stored;
    a plurality of second lookup tables in which a plurality of tuning codes for adjusting an impedance of the variable element corresponding to a plurality of states of the electronic device is stored; and
    a third lookup table in which the plurality of second lookup tables corresponding to the plurality of frequency bands is stored.

8. The electronic device as claimed in claim 7, wherein the control circuit is configured to:
  determine a power adjustment value corresponding to a frequency band of the signal by referring to the first lookup table;
  determine a second lookup table corresponding to the frequency band by referring to the third lookup table; and
  determine the tuning code corresponding to a state of the electronic device by referring to the second lookup table.

9. The electronic device as claimed in claim 7, wherein the plurality of states of the electronic device comprises a state in which the electronic device is adjacent to the external object within a designated distance or less.

10. An operating method of an electronic device, the electronic device comprising an amplification circuit, an antenna configured to be electrically connected to the amplification circuit, and a variable element configured to adjust an impedance between the amplification circuit and the antenna, the method comprising:
  outputting a signal amplified by a designated gain using the amplification circuit to an external electronic device using the antenna, with the variable element adjusted to a first impedance;
  detecting that an external object is adjacent while outputting the signal;
  identifying a tuning code for changing the first impedance of the variable element to a second impedance upon detecting that the external object is adjacent;
  adjusting the designated gain based on a first power adjustment value when the tuning code belongs to a first group; and
  refraining from adjusting the designated gain when the tuning code belongs to a second group.

11. The method as claimed in claim 10, further comprising:
  determining that the tuning code belongs to the first group when a transmission power value of a signal output based on the second impedance is greater than a first transmission power value; and
  determining that the tuning code belongs to the second group when the transmission power value of the signal output based on the second impedance is less than a second transmission power value,
  wherein the first transmission power value is greater than the second transmission power value.

12. The method as claimed in claim 11, further comprising:
  determining that the tuning code belongs to a third group when the transmission power value of the signal output based on the second impedance is less than the first transmission power value and is greater than the second transmission power value; and
  adjusting the designated gain based on a second power adjustment value when the tuning code belongs to the third group, wherein the second power adjustment value is less than the first power adjustment value.

13. The method as claimed in claim 10, further comprising adjusting the designated gain based at least on the tuning code when a frequency band of the signal is a designated frequency band.

* * * * *